US009143109B2

(12) United States Patent
Fang et al.

(10) Patent No.: US 9,143,109 B2
(45) Date of Patent: Sep. 22, 2015

(54) WIDEBAND INDUCTOR-LESS BALUN-LNA WITH IMPROVED PICKUP NOISE REJECTION

(71) Applicant: BROADCOM CORPORATION, Irvine, CA (US)

(72) Inventors: Jie Fang, Austin, TX (US); Frank Wayne Singor, Austin, TX (US)

(73) Assignee: BROADCOM CORPORATION, Irvine, CA (US)

( * ) Notice: Subject to any disclaimer, the term of this patent is extended or adjusted under 35 U.S.C. 154(b) by 73 days.

(21) Appl. No.: 14/042,622

(22) Filed: Sep. 30, 2013

(65) Prior Publication Data

US 2015/0061766 A1      Mar. 5, 2015

Related U.S. Application Data

(60) Provisional application No. 61/871,805, filed on Aug. 29, 2013.

(51) Int. Cl.
*H03G 3/30* (2006.01)
*H03F 3/193* (2006.01)
*H03F 1/26* (2006.01)
*H03F 3/45* (2006.01)

(52) U.S. Cl.
CPC .. *H03G 3/30* (2013.01); *H03F 1/26* (2013.01); *H03F 3/193* (2013.01); *H03F 3/45179* (2013.01); *H03F 3/45632* (2013.01); *H03F 2200/294* (2013.01); *H03F 2203/45018* (2013.01); *H03F 2203/45521* (2013.01); *H03F 2203/45528* (2013.01); *H03F 2203/45591* (2013.01)

(58) Field of Classification Search
USPC .................................................. 330/252–261
See application file for complete search history.

(56) References Cited

U.S. PATENT DOCUMENTS 6,377,122 B1 *   4/2002   Rokhsaz ........................ 330/253

OTHER PUBLICATIONS

D. Im et al., "A Broadband CMOS RF Front-End for Universal Tuners Supporting Multi-Standard Terrestrial and Cable Broadcasts," IEEE J. Solid-State Circuits, vol. 47, No. 2, pp. 392-406, Feb. 2012.
J. Borremans, et al., "Low-Area Active-Feedback Low-Noise Amplifier Design in Scaled Digital CMOS," IEEE J. Solid-State Circuits, vol. 43, No. 11, pp. 2422-2433, Nov. 2008.
B. Welch et al., "A 20-GHz Low-Noise Amplifier With Active Balun in a 0.25-m SiGe BICMOS Technology," IEEE J. Solid-State Circuits, vol. 40, No. 10, pp. 2092-2097, Oct. 2005.

(Continued)

*Primary Examiner* — Hieu Nguyen
(74) *Attorney, Agent, or Firm* — McDermott Will & Emery LLP

(57) ABSTRACT

An inductor-less balun low-noise amplifier (LNA) includes a cross-coupled network coupled between first and second input terminals and first and second summing nodes. The cross-coupled network may include: a first non-inverting gain stage coupled between the first input terminal and the first summing node; a first inverting gain stage coupled between the first input terminal and the second summing node; a second non-inverting gain stage coupled between the second input terminal and the second summing node; and a second inverting gain stage coupled between the second input terminal and the first summing node. The cross coupled network may be configurable to provide common-mode rejection when operated in a differential or in a single-ended mode of operation.

20 Claims, 5 Drawing Sheets

(56) References Cited

OTHER PUBLICATIONS

S. Joo et al., "A 3-to-5 GHz UWB LNA with a Low-Power Balanced Active Balun," in Proc IEEE Radio Freq. Integr. Circuits (RFIC) Symposium, Jun. 2009, pp. 303-306.

H. Ma et al., "Novel Active Differential Phase Splitters in RFIC for Wireless Applications," IEEE Trans. Microwave Theory Tech., vol. 46, No. 12, pp. 2597-2603, Dec. 1998.

S. Blaakmeer et al., "Wideband Balun-LNA With Simultaneous Output Balancing, Noise-Canceling and Distortion-Canceling," IEEE J. Solid-State Circuits, vol. 43, No. 6, pp. 1341-1350, Jun. 2008.

D. Mastantuono et al., "A Low Noise Active Balun with IM2 Cancellation for Multiband Portable DVB-H Receivers," in Proc IEEE Int. Solid-State Circuits Conf. Dig. Tech Papers, San Francisco, CA, Feb. 2009, pp. 216-217.

J. Kim et al., "Wideband Inductorless Balun-LNA Employing Feedback for Low-Power Low-Voltage Applications," IEEE J. Solid-State Circuits, vol. 60, No. 9, pp. 2833-2842, Sep. 2012.

D. Im et al., "A CMOS Active Feedback Balun-LNA With High IIP2 for Wideband Digital TV Receivers," IEEE Trans on Microwave theory and techniques, vol. 58, No. 12, pp. 3566-3578, Dec. 2010.

\* cited by examiner

WIDEBAND INDUCTOR-LESS BALUN-LNA WITH IMPROVED PICKUP NOISE REJECTION

CROSS-REFERENCE TO RELATED APPLICATIONS

This application claims the benefit of priority under 35 U.S.C. §119 from U.S. Provisional Patent Application 61/871,805 filed Aug. 29, 2013, which is incorporated herein by reference in its entirety.

TECHNICAL FIELD

The present description relates generally to communication systems, and more particularly, but not exclusively, to wideband inductor-less balun-LNA with improved pickup noise rejection.

BACKGROUND

Many communication receivers use one or more low-noise amplifiers (LNAs) at the front end of the receiver (e.g., close to an antenna) to amplify weak signals received from the antenna or the cable. The LNA can play a role in reducing the effect of the noise generated by the subsequent stages of the receive chain, as these noises are reduced by the gain of the LNA. Therefore an LNA may be required to contribute as little as possible to the noise and signal distortion, while boosting the gain of the receive chain. Various wideband applications such as satellite set-top-boxes (STBs), satellite outdoor units (ODUs), IP low-noise block (IP-LNB) tuners, cable tuners, and MoCA tuners may need radio-frequency (RF) programmable gain and single-end-to-differential conversion that can be implemented before or as a part of a wideband LNA.

Existing solutions include off-chip and on-chip balun circuits that may suffer from a number of drawbacks. For instance, they can be costly, may have difficulty in supporting a wide frequency range, may lack sufficient common-mode/supply rejection and second order distortion performance, may not be sufficiently compact, may have an insertion loss (e.g., 1 dB), and/or may not support differential mode signaling.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

The subject technology is directed to a wideband inductor-less balun-LNA with improved pickup noise rejection. The disclosed device may allow a single-ended-to differential conversion across a wide frequency range with a desirable second order distortion performance, without using any inductor. The subject technology can improve rejection to board pick-up spurs, save cost, and reduce insertion loss by eliminating the need for an off-chip balun, and may be compatible for both single-ended mode and differential mode of operation.

Figure 1A:
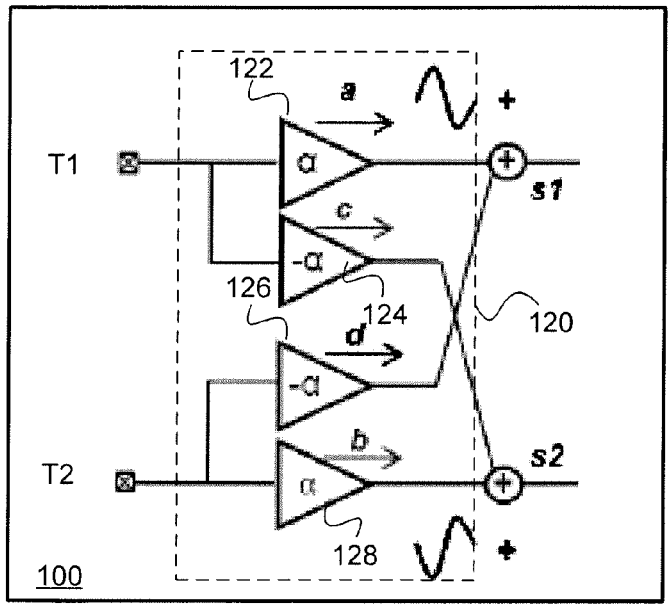
FIGS. 1A-1B are conceptual diagrams illustrating examples of a wideband inductor-less balun-LNA with improved pickup noise rejection, in accordance with one or more implementations.
Figure 1B:
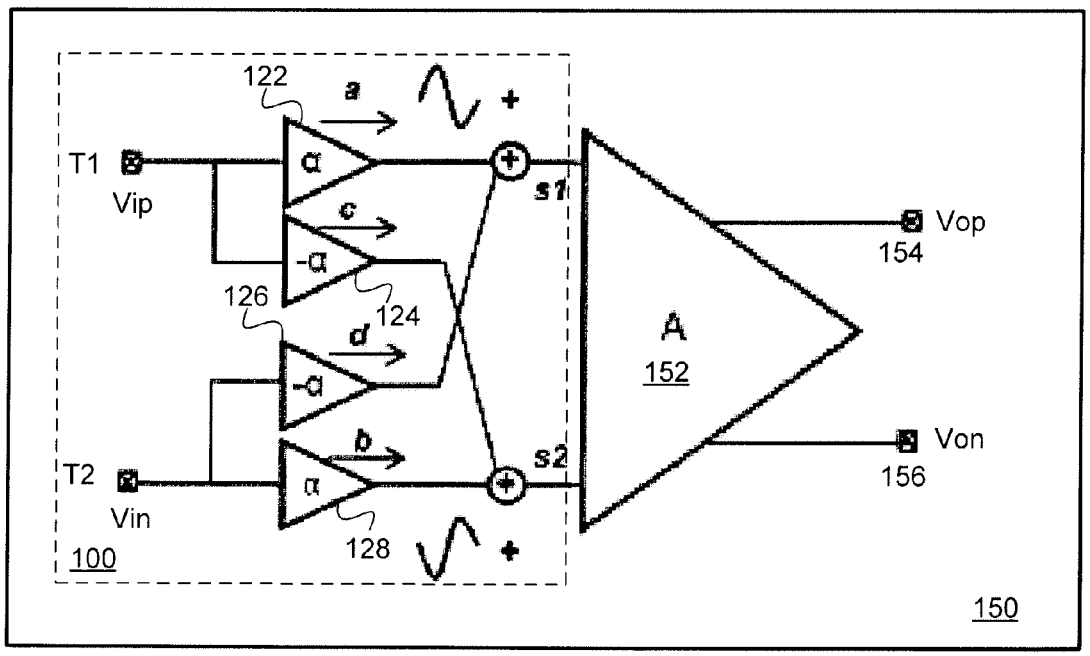

FIGS. 1A-1B are conceptual diagrams illustrating examples of wideband inductor-less balun-LNAs 100 and 150 with improved pickup noise rejection, in accordance with one or more implementations of the subject technology. The wideband inductor-less balun-LNA 100, as shown in FIG. 1A, may include a cross-coupled network 120 coupled between input terminals (e.g., T1 and T2) and summing nodes (e.g. S1 and S2). The cross-coupled network 120 may include: A first non-inverting gain stage 122 coupled between a first terminal T1 and a first summing node S1 (e.g., a path a); a first inverting gain stage 124 coupled between the first terminal T1 and a second summing node S2 (e.g., a path c); a second non-inverting gain stage 128 coupled between the second terminal T2 and the second summing node S2 (e.g., a path b); and a second inverting gain stage 126 coupled between the second terminal T2 and the first summing node S1 (e.g., a path d). The cross coupled network 120 may be configured to provide a common-mode rejection when operated in a differential or in a single-ended mode of operation. The common-mode rejection may be sufficiently high to significantly improve spur pickup (e.g., from a circuit board such as a printed circuit (PC) board).

In one or more implementations, the summing nodes S1 and S2 may be coupled to a differential amplifier 152, as shown in FIG. 1B, to form a wideband inductor-less balun-LNA 150. The differential amplifier 152 can provide an additional gain to the cross coupled network 120. The first and second non-inverting stages 122 and 128 and the first and second inverting gain stages 124 and 126 may be configured to have a common gain α. Each of the first and second non-inverting gain stages 122 and 128 may include a source follower stage, and each of the first and second inverting gain stages 124 and 126 may include a unity-gain common source stage. In the differential mode of operation, the differential input signals may be coupled to the first and second terminals T1 and T2, and the differential input signals can be amplified by a differential gain of 2α. In some aspects, in the single-ended mode of operation, a single-ended input signal may be coupled to one of the terminals T1 or T2 (e.g., T1) and the other terminal (e.g., T2) may be coupled to an AC ground potential through a matching resistor (e.g. matching an output impedance of a board filter~75Ω). The matching can help the spurs picked up from the circuit board to be treated as a common-mode signal and substantially rejected by the balun LNA 150. The single-ended input signal can be amplified by a single-ended gain of 2α. The output voltage signals (e.g., Von and Vop) of the differential amplifier 200 may be provided at terminals 154 and 156.

Figure 2:
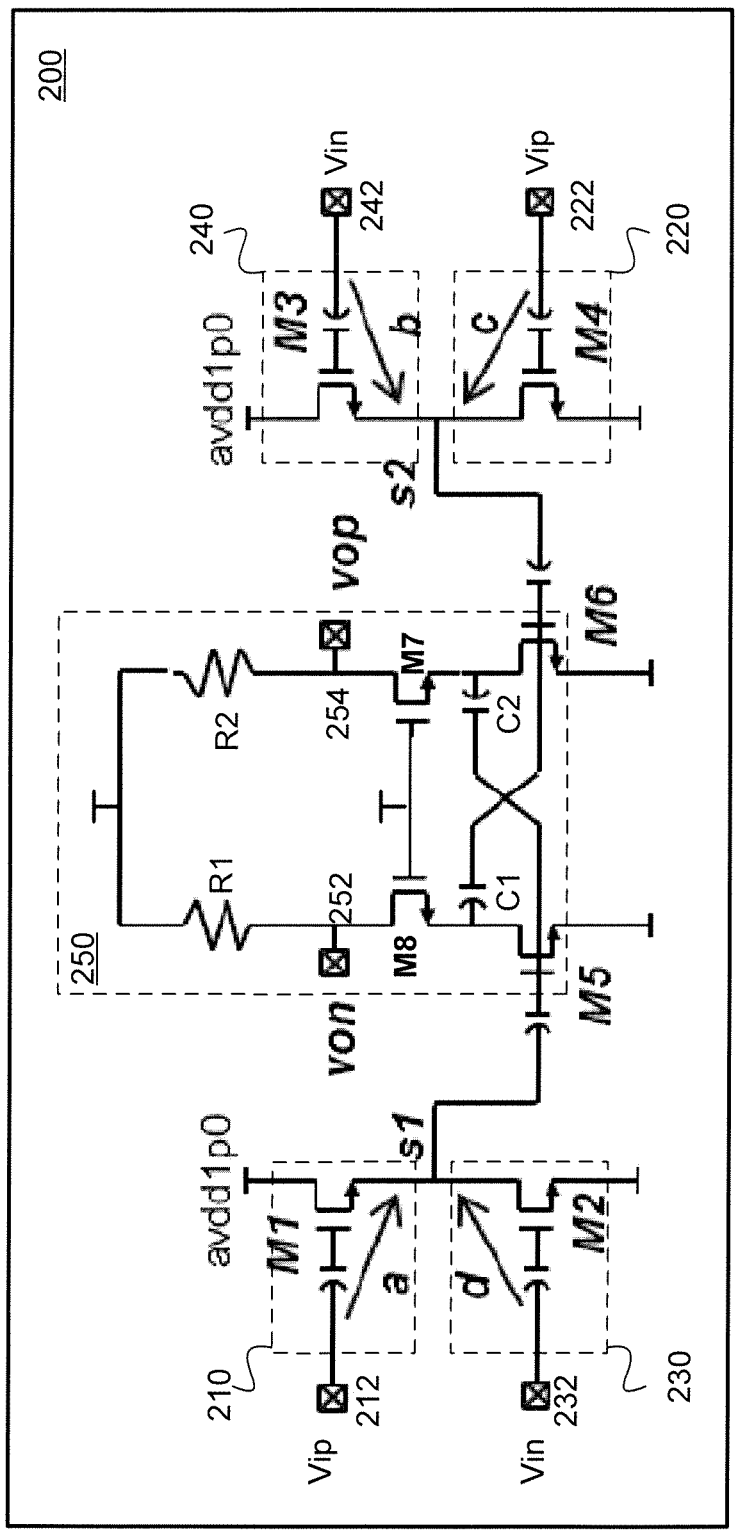
FIG. 2 illustrates an example of a wideband inductor-less balun-LNA with improved pickup noise rejection, in accordance with one or more implementations.

FIG. 2 illustrates an example of a wideband inductor-less balun-LNA 200 with improved pickup noise rejection, in accordance with one or more implementations of the subject technology. The wideband inductor-less balun-LNA (hereinafter "balun-LNA) 200 includes a first non-inverting gain stage 210 (e.g., in a path a), a first inverting gain stage 220 (e.g., in a path c), a second non-inverting gain stage 240 (e.g., in a path b), a second inverting gain stage 230 (e.g., in a path d). The first and second non-inverting gain stages 210 and 240 include source follower stages (or emitter follower stages in case of bipolar technology) formed by transistors M1 and M3, respectively. The first and the second inverting gain stages 220 and 230 include unity-gain common-source amplifiers formed by transistors M4 and M2, respectively. In some aspects, the first and second non-inverting gain stages 210 and 240 and the first and the second inverting gain stages 220 and 230 may be implemented by using other circuit configurations. All of the capacitors shown in FIG. 2 are coupling capacitors; in particular, the cross-coupled capacitors C1 and C2 can help with balancing the signal paths in a differential amplifier 250. The differential amplifier 250 is an example cascode pair implementation of the differential amplifier 152 of FIG. 1B. In some aspects, the differential amplifier 152 may be implemented by using other circuit configurations. The cascode pairs are formed by the transistor pairs M5-M8 and M6-M7. In some aspects, the transistors M1-M8 may be MOS transistors, but may not be limited to MOS transistors. The load resistors R1 and R2 may have the same resistance or different resistances. The nodes S1 and S2 are the same as the summation nodes S1 and S2 of FIGS. 1A and 1B. The input nodes 212 and 222 are coupled together and are the same as the terminal T1 of FIGS. 1A and 1B. The input nodes 232 and 242 are coupled together and are the same as the terminal T2 of FIGS. 1A and 1B. The output voltage signals (e.g., Von and Vop) of the balun-LNA 200 may be provided at terminals 252 and 254.

Figure 3:
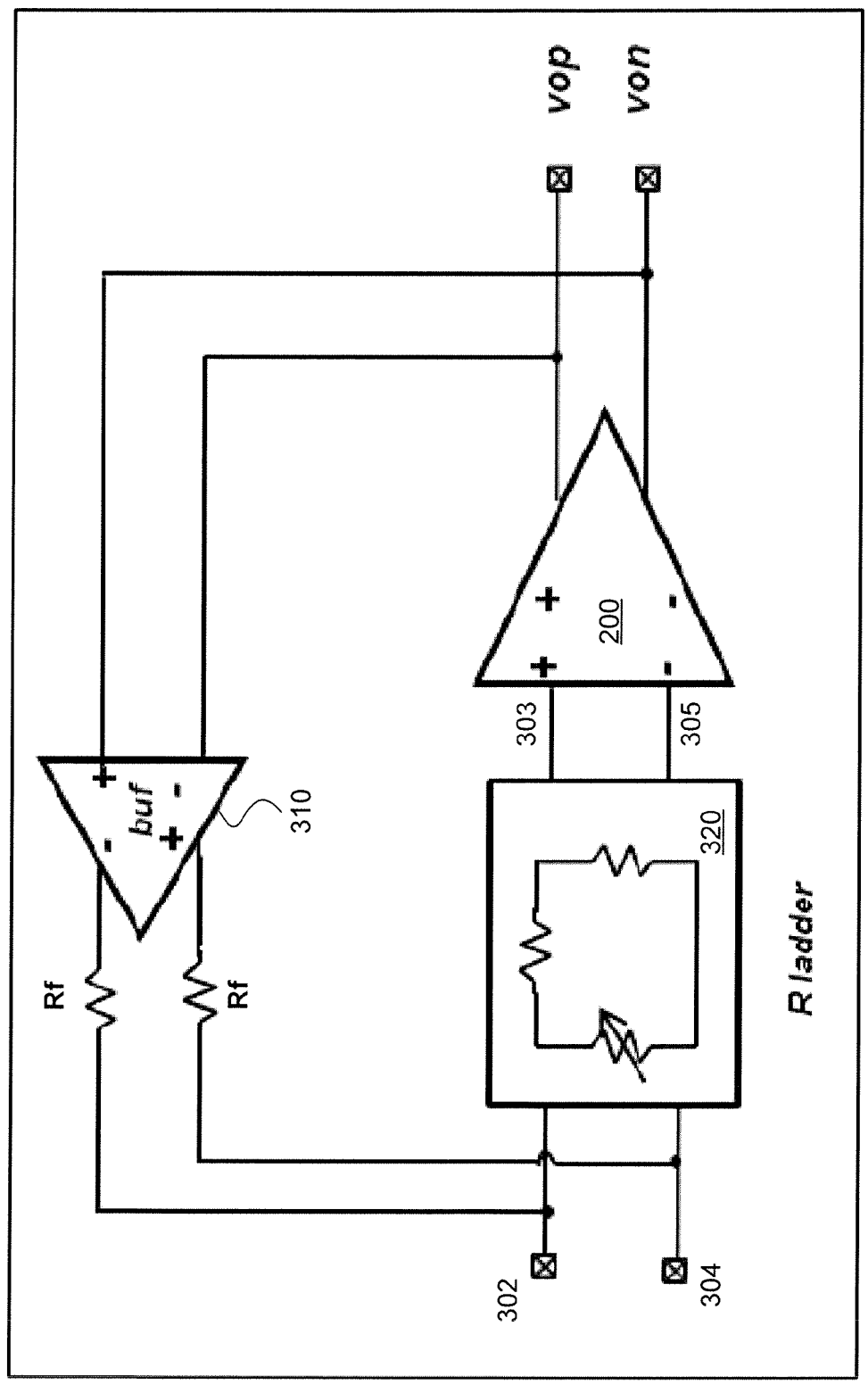
FIG. 3 illustrates an example of using a wideband inductor-less balun-LNA in a feedback loop, in accordance with one or more implementations.

FIG. 3 illustrates an example of using a wideband inductor-less balun-LNA 200 of FIG. 2 in a feedback loop, in accordance with one or more implementations of the subject technology. The feedback loop comprises the balun-LNA 200, a buffer 310, an R ladder circuit 320, and feedback resistors (e.g., with resistance Rf). The R-ladder circuit 320 may be coupled between input nodes 302 and 304 and balun-LNA input terminals 303 and 305. In some aspects, the feedback loop may be a negative shunt feedback loop that can achieve a wideband impedance matching at the input nodes 302 and 304. It is understood that the effective input impedance at the input nodes 302 and 304 is defined by the resistance Rf and the loop gain (e.g., Rie~Rf/loop gain). The negative shunt feedback loop may further improve distortion performance and decouple noise figure (NF) from the input impedance. The negative feedback loop senses the differential output voltage (e.g., Vop-Von) by the buffer 310 that converts the differential output voltage into feedback currents provided through feedback resistors to the input nodes 302 and 304.

The NF that is decoupled from the input impedance can be lowered by increasing the transconductance (e.g., $g_m$) of transconductors of the balun-LNA 200.

Figure 4:
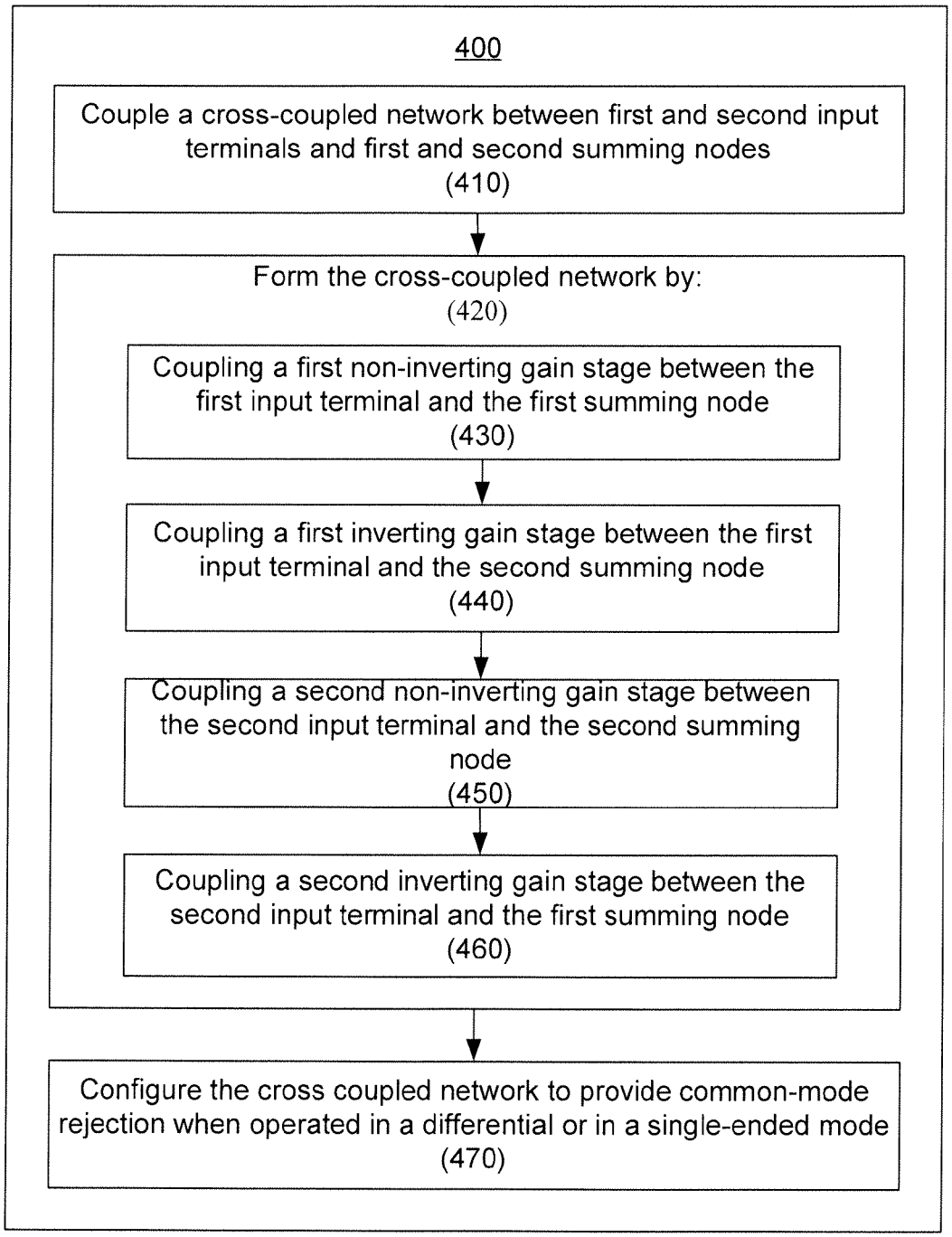
FIG. 4 illustrates an example of a method for providing a wideband inductor-less balun-LNA with improved pickup noise rejection, in accordance with one or more implementations.

FIG. 4 illustrates an example of a method 400 for providing a wideband inductor-less balun-LNA with improved pickup noise rejection, in accordance with one or more implementations of the subject technology. The steps of the method 400 do not need to be performed in the order shown and one or more steps may be omitted. A cross-coupled network (e.g., 120 of FIG. 1A) may be coupled between first and second input terminals (e.g., T1 and T2 of FIG. 1A) and first and second summing nodes (e.g., S1 and S2 of FIG. 1A) (410). The cross-coupled network may be formed (420) by: coupling a first non-inverting gain stage (e.g., 122 of FIG. 1A) between the first input terminal (e.g., T1 of FIG. 1A) and the first summing node (430); coupling a first inverting gain stage (e.g., 124 of FIG. 1A) between the first input terminal and the second summing node (e.g., S2 of FIG. 1A) (440); coupling a second non-inverting gain stage (e.g., 126 of FIG. 1A) between the second input terminal (e.g., T2 of FIG. 1A) and the second summing node (450); and coupling a second inverting gain stage (e.g., 128 of FIG. 1A) between the second input terminal and the first summing node (e.g., S1 of FIG. 1A) (460). The cross coupled network may be configured to provide common-mode rejection when operated in a differential or in a single-ended mode of operation (470).

Figure 5:
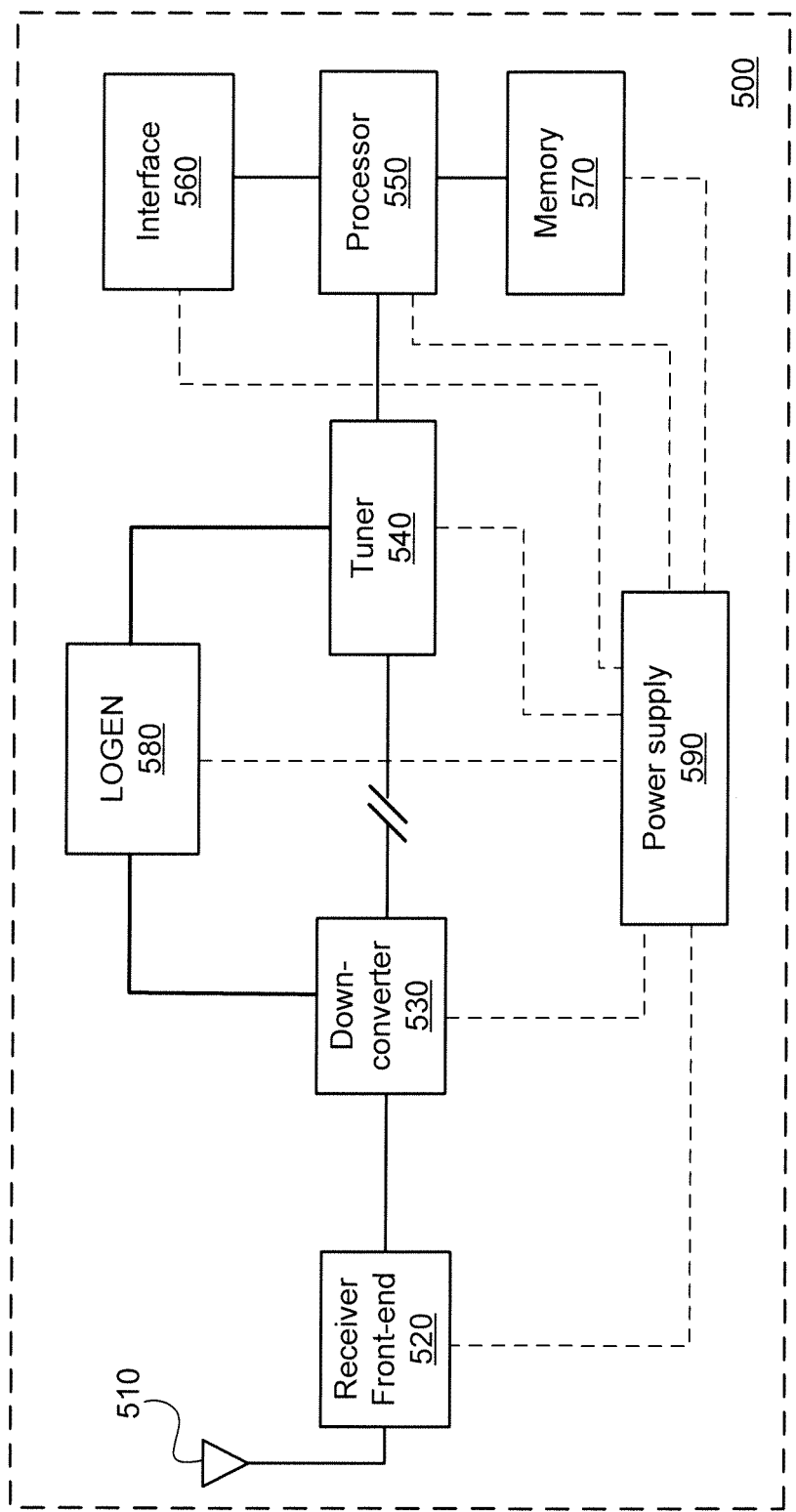
FIG. 5 illustrates an example of a communication device using a wideband inductor-less balun-LNA with improved pickup noise rejection, in accordance with one or more implementations.

FIG. 5 illustrates an example of a communication device using a wideband inductor-less balun-LNA with improved pickup noise rejection, in accordance with one or more implementations of the subject technology. The communication device 500 may comprise a broadband communication device such as a satellite receiver. The communication device 500 may include a feed 510 coupled to a satellite antenna, a receiver front-end 520, a down-converter 530, a tuner 540, a processor 550, an interface 560, a memory 570, a local oscillator generator (LOGEN) 580, and a power supply 590. In various embodiments of the subject technology, the communication device 500 may include other modules or components not shown here for simplicity. One or more of the blocks represented in FIG. 5 may be integrated on one or more semiconductor substrates. For example, the blocks 520-580 may be realized in a single chip or a single system on chip, or may be realized in a multi-chip chipset.

The feed 510 may be suitable for receiving broadband signals (e.g., satellite signals) over a wide range of frequencies. Although a single feed 510 is illustrated, the subject technology is not so limited.

In one or more implementations, the receiver front end 520 may include a wideband inductor-less balun-LNA as shown in FIGS. 1B, 2, and 3, which can allow a single-ended-to differential conversion across a wide frequency range with a desirable second order distortion performance, improved rejection to board pick-up spurs, and less cost. The wideband inductor-less balun-LNA may further eliminate the need for an off-chip balun, and may be compatible for both single-ended mode and differential mode of operation.

The down-converter 530 may comprise suitable logic, circuitry, interfaces, and/or code that can use local oscillator (LO) signals generated by the LO generator (LOGEN) 580 to down-convert the satellite signals (e.g., at 12 GHz) to radio-frequency (RF) signals (e.g., at 950-2150 MHz). The tuner 540 may comprise suitable logic, circuitry, interfaces, and/or code that can use proper LO signals generated by the LOGEN 580 to down-convert the RF signals and to generate baseband signals.

The processor 550 may comprise suitable logic, circuitry, and/or code that may enable processing data and/or controlling operations of the communication device 500. In this regard, the processor 550 may be enabled to provide control signals to various other portions of the communication device 500. The processor 550 may also control transfers of data between various portions of the communication device 500. Additionally, the processor 550 may enable implementation of an operating system or otherwise execute code to manage operations of the communication device 500.

In one or more implementations, the processor 550 may include/represent a baseband processor. The baseband processor may comprise suitable logic, circuitry, interfaces, and/or code that may be operable to perform processing of baseband signals. The baseband processor may, for example, analyze received signals and generate control and/or feedback signals for configuring various components of the communication device 500 such as the receiver front-end 520. The baseband processor may be operable to encode, decode, transcode, modulate, demodulate, encrypt, decrypt, scramble, descramble, and/or otherwise process data in accordance with one or more communications standards.

The memory 570 may comprise suitable logic, circuitry, and/or code that may enable storage of various types of information such as received data, generated data, code, and/or configuration information. The memory 570 may comprise, for example, RAM, ROM, flash, and/or magnetic storage. In various embodiment of the subject technology, Information stored in the memory 570 may be utilized for configuring the receiver front-end 520 and/or the processor 550.

The local oscillator generator (LOG EN) 580 may comprise suitable logic, circuitry, interfaces, and/or code that may be operable to generate one or more oscillating signals of one or more frequencies. The LOGEN 580 may be operable to generate digital and/or analog signals. In this manner, the LOGEN 580 may be operable to generate one or more clock signals and/or sinusoidal signals. Characteristics of the oscillating signals such as the frequency and duty cycle may be determined based on one or more control signals from, for example, the processor 550 and/or the processor 550. In operation, the processor 550 may configure the various components of the communication device 500 based on a communication standard according to which it is desired to receive signals. Broadband signals may be received via the feed 510 and amplified by the receive front-end 520 and down-converted by the down-converter 530. The baseband processing module may perform noise estimation and/or noise cancellation, decoding, and/or demodulation of the baseband signals. In this manner, information in the received signal may be recovered and utilized appropriately. For example, the information may be audio and/or video to be presented to a user of the communication device, data to be stored to the memory 570, and/or information affecting and/or enabling operation of the communication device 500. The baseband processing module 540 may modulate, encode and perform other processing on audio, video, and/or control signals to be processed by the interface device 560 and to be sent to a display device, such as TV set. The power supply 580 may provide one or more regulated rail voltages (e.g., $V_{DD}$) for various circuitries of the communication device 500.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device comprising:
    a cross-coupled network coupled between first and second input terminals and first and second summing nodes;
    the cross-coupled network comprising:
        a first non-inverting gain stage coupled between the first input terminal and the first summing node;
        a first inverting gain stage coupled between the first input terminal and the second summing node;
        a second non-inverting gain stage coupled between the second input terminal and the second summing node; and
        a second inverting gain stage coupled between the second input terminal and the first summing node,
    wherein the first and second summing nodes are coupled to a cascode differential amplifier including cross-coupled capacitors.

2. The device claim 1, wherein the device is configured to provide a wideband response with improved distortion performance.

3. The device of claim 1, wherein each of the first and second non-inverting gain stages comprises a source-follower stage, and wherein each of the first and second inverting gain stages comprises a unity-gain common source stage.

4. The device of claim 1, wherein the first and second non-inverting and inverting gain stages are configured to have a common gain.

5. The device of claim 4, wherein in a differential mode of operation, differential input signals are coupled to the first and second input terminals, and wherein the differential input signals are amplified by a differential gain that is twice the common gain.

6. The device of claim 4, wherein in a single-ended mode of operation, a single-ended input signal is coupled to one of the first or the second input terminals, and another one of the first or the second input terminals is coupled to a ground potential through a matching resistor, and wherein the single-ended input signal is amplifiable by a single-ended gain that is twice the common gain.

7. The device of claim 1, wherein the cross-coupled network is coupled in a shunt feedback loop, wherein the shunt feedback loop is configured to achieve a wideband impedance matching.

8. The device of claim 7, wherein the first and second summing nodes are coupled to a differential amplifier to form a balun-low-noise amplifier (LNA), wherein the balun-LNA is coupled in the shunt feedback loop.

9. The device of claim 8, wherein the feedback loop further comprises a buffer circuit, wherein the buffer circuit is configured to convert an output voltage of the balun-LNA to a current to allow the current to be fed back to input nodes of the balun-LNA to form a negative feedback loop.

10. A method for providing a balun-low-noise amplifier (LNA), the method comprising:
    coupling a cross-coupled network between first and second input terminals and first and second summing nodes;
    forming the cross-coupled network by:
        coupling a first non-inverting gain stage between the first input terminal and the first summing node;
        coupling a first inverting gain stage between the first input terminal and the second summing node;
        coupling a second non-inverting gain stage between the second input terminal and the second summing node; and
        coupling a second inverting gain stage between the second input terminal and the first summing node; and
    coupling the first and second summing nodes to a cascode differential amplifier including cross-coupled capacitors.

11. The method claim 10, further comprising configuring the balun-LNA to provide a wideband response with improved distortion performance.

12. The method of claim 10, further comprising forming each of the first and second non-inverting gain stages by using a source-follower stage, and forming each of the first and second inverting gain stages by using a unity-gain common source stage.

13. The method of claim 10, further comprising configuring the first and second non-inverting and inverting gain stages to have a common gain, coupling, in a differential mode of operation, differential input signals to the first and second terminals, and amplifying the differential input signals by using a differential gain that is twice the common gain.

14. The method of claim 13, further comprising coupling, in a single-ended mode of operation, a single-ended input signal to one of the first or the second terminals and another one of the first or the second terminals to a ground potential through a matching resistor, and amplifying the single-ended input signal by a single-ended gain that is twice the common gain.

15. The method of claim 10, further comprising coupling the cross-coupled network in a shunt feedback loop, and configuring the shunt feedback loop to achieve a wideband impedance matching.

16. The method of claim 15, further comprising coupling the first and second summing nodes to a differential amplifier to form the balun-LNA and coupling the balun-LNA in the shunt feedback loop.

17. The method of claim 16, further comprising forming the feedback by using a buffer circuit, configuring the buffer circuit to convert an output voltage of the balun-LNA to a current, and feeding back the current to input nodes of the balun-LNA to form a negative feedback loop.

18. A circuit for a cross-coupled balun low-noise amplifier (LNA), the circuit comprising:
  a cross-coupled network coupled between first and second input terminals and first and second summing nodes; and
  a gain stage coupled to the first and second summing nodes and configured to provide an additional gain,
  wherein the cross-coupled network comprises:
    a first non-inverting gain stage coupled between the first input terminal and the first summing node;
    a first inverting gain stage coupled between the first input terminal and the second summing node;
    a second non-inverting gain stage coupled between the second input terminal and the second summing node; and
    a second inverting gain stage coupled between the second input terminal and the first summing node, and wherein the first and second summing nodes are coupled to a cascode differential amplifier including cross-coupled capacitors.

19. The circuit of claim 18, wherein each of the first and second non-inverting gain stages comprises a source-follower stage, and wherein each of the first and second inverting gain stages comprises a unity-gain common source stage.

20. The circuit of claim 18, wherein in a differential mode of operation, differential input signals are coupled to the first and second input terminals, wherein the first and second non-inverting and inverting gain stages are configured to have a common gain, and wherein the differential input signals are amplified by a differential gain that is twice the common gain.

* * * * *